United States Patent [19]

Hung et al.

[11] Patent Number: 5,770,523
[45] Date of Patent: Jun. 23, 1998

[54] METHOD FOR REMOVAL OF PHOTORESIST RESIDUE AFTER DRY METAL ETCH

[75] Inventors: Ming-Yeon Hung, Hsin-Chu; Janet Yu, Chang-hua; Weng-Liang Fang, Hsin-Chu; Chang-Ching Kin, Hsin-chu Hsien, all of Taiwan

[73] Assignee: Taiwan Semiconductor Manufacturing Company, Ltd., Hsin-Chu, Taiwan

[21] Appl. No.: 709,697

[22] Filed: Sep. 9, 1996

[51] Int. Cl.[6] .................................................... C25F 3/30
[52] U.S. Cl. ......................... 438/725; 438/714; 438/906; 438/963; 134/1.2
[58] Field of Search .................................... 438/725, 714, 438/906, 963; 134/1.2

[56] References Cited

U.S. PATENT DOCUMENTS

| | | | |
|---|---|---|---|
| 4,501,061 | 2/1985 | Wonnacott | 438/725 |
| 4,975,146 | 12/1990 | Knapp et al. | 156/643 |
| 5,202,291 | 4/1993 | Charvat et al. | 437/245 |
| 5,320,707 | 6/1994 | Kanekiyo et al. | 156/665 |
| 5,320,709 | 6/1994 | Bowden et al. | 156/667 |
| 5,356,478 | 10/1994 | Chen et al. | 134/1 |
| 5,411,631 | 5/1995 | Hori et al. | 216/72 |

Primary Examiner—Deborah Jones
Attorney, Agent, or Firm—George O. Saile; Stephen B. Ackerman

[57] ABSTRACT

A method is provided for the removal of the surface layer of the residual photoresist mask pattern used for metal subtractive etching which uses the same reactor equipment but employs reactive fluorine-containing gases to form volatile compounds with the surface layer, so that subsequently a conventional oxygen plasma stripping process can be used for complete resist residue removal without requiring excessive temperature exposure of the integrated circuit devices.

14 Claims, 1 Drawing Sheet

METHOD FOR REMOVAL OF PHOTORESIST RESIDUE AFTER DRY METAL ETCH

BACKGROUND OF THE INVENTION

1. Field of the Invention

This invention relates to the removal of photoresist residues produced in the fabrication of semiconductor integrated circuits and more particularly to the photoresist residues remaining after the dry subtractive etching of metal layer patterns.

2. Description of the Prior Art

In the fabrication of semiconductor integrated circuits, metal patterns used for interconnection and other purposes are formed by subtractive etching through a mask pattern of photoresist. If the etching of the metal is done by dry methods involving reactive gases such as halogen compounds, the resist mask residue remaining is often difficult to remove. This is usually done in a resist stripping chamber, in which an electrical plasma-activated oxygen gas environment is employed to react with and remove the organic resist material. The resist removal rate is strongly temperature-dependent, increasing greatly as temperature increases. However, high temperature during striping of resist is undesirable, since it promotes surface roughness increase of the remaining metal due to grain growth and recrystallization. If the resist residue is not completely removed, the manufacturing yield and reliability of integrated circuit devices is decreased, and the cost is increased due to the necessity for increased visual inspection. Although subtractive etching of metal patterns by reactive gases is discussed extensively by authoritative sources such as "VLSI Technology" by S. M. Sze, 2nd Ed., McGraw-Hill Book Co., Singapore 1988, neither the problem of resist residue removal nor the avoidance of excessive temperatures are discussed. There have also been disclosed in the art various Reactive Ion Etch (RIE) methods and materials for forming patterned aluminum containing conductor layers within integrated circuits. For example, Charvat et al. in U.S. Pat, No. 5,202,291 disclose an RIE method for forming an aluminum containing conductor layer through employing a comparatively high carbon tetrafluoride (CF4) gas flow within the RIE etchant gas composition. In addition, Kanekiyo et al. in U.S. Pat. No. 5,320,707 disclose an RIE method for forming an aluminum containing conductor layer with uniform sidewall profiles. Finally, Hori et al. in U.S. Pat. No. 5,411,631 disclose a method for forming a patterned aluminum containing conductor layer within an integrated circuit. The method employs both the RIE plasma etching characteristics and the sputter etching characteristics of a boron trichloride (13C13) containing etchant gas composition. However, none of the cited references refer to the difficulty of removing photoresist residue after RIE processing or its deleterious effect on the properties of the aluminum containing conductor layer in the integrated circuit.

It has been observed that the most intractable portion of the resist residue towards easy removal is the top surface region, which apparently interacts with the reactive environment during metal subtractive etching. This surface region is thought to be resistant to oxygen during the stripping process, forming non-reactive non-volatile substances which impede the reaction of the rest of the resist residue and thus interferes with stripping. It is further thought that the surface region consists of oxidized species derived from the metal during reactive etching which is not reactive towards the oxygen plasma until higher temperatures are employed. Thus, the present invention is directed towards the goal of providing within integrated circuit manufacture a Reactive Ion Etch (RIE) method for sequentially forming a patterned aluminum containing conductor layer from a blanket aluminum containing conductor layer and subsequently stripping a photoresist layer which had defined the said pattern without roughening or otherwise damaging the aluminum containing conductor layer by such subsequent stripping processes.

SUMMARY OF THE INVENTION

It is a principal object of the invention to provide a method for enhancing the stripping of photomask residues after subtractive metal etching with reactive gases without requiring excessive high temperatures or extensive rework cycles. In accordance with the object of the invention, a method is provided for the removal of the surface layer of the residual photoresist mask pattern used for metal subtractive etching which uses the same equipment but employs fluorine-containing reactive gases to form volatile compounds with the surface layer, so that subsequently a conventional oxygen plasma stripping process can be used for complete resist residue removal, without requiring excessive temperature exposure of the integrated circuit devices under fabrication.

DESCRIPTION OF THE PREFERRED EMBODIMENT

Figure 1:
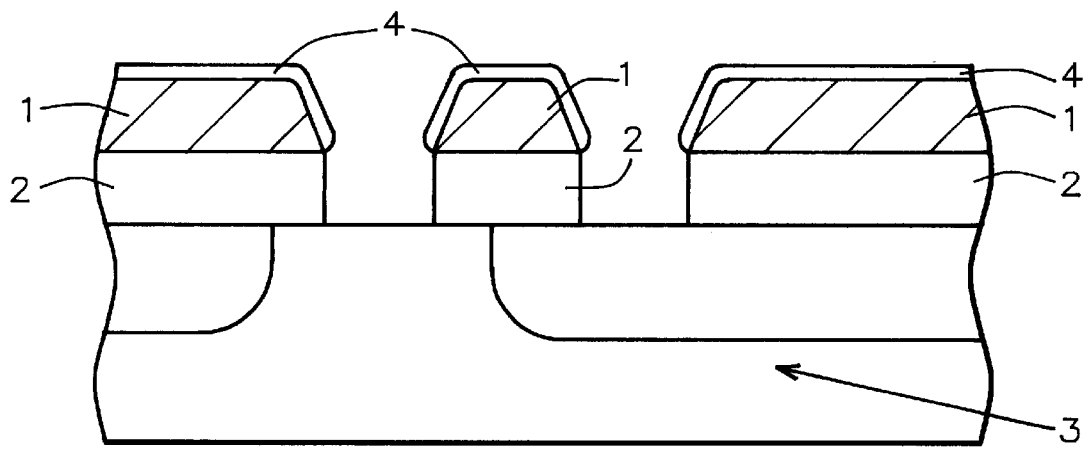
FIG. 1 is a schematic diagram of the prior art of photoresist residue containing a surface layer of material which is difficult to strip remaining after metal subtractive etch.

Referring now more particularly to FIG. 1, there is shown a schematic diagram of the photoresist residuel remaining after subtractive etching of a metal patern 2 in the fabrication of an integrated circuit device 3. On the surface of the remaining photoresist is a layer of material 4 which is difficult to remove in the conventional photoresist stripping process, which is a reaction to form completely volatile compounds between the photoresist and oxygen gas in a plasma-activated reactor chamber. During the metal subtractive etching process for which the photoresist pattern served as the etching mask, it is thought that certain reaction products of the metal etching step and interactions between the reactive plasma and the photoresist surface have combined to form thereon a layer of material which is not readily converted to volatile substances in the subsequent photoresist stripping process in an oxygen plasma. Hence, the removal of photoresist residues is not accomplished to the degree of completion required in the manufacture of integrated circuit devices, with subsequent deleterious impact on device yield and reliability. The removal of photoresist residues under these conditions can be expedited by raising the power input and temperature of the device, but this causes unwanted side effects such as the increased atomic surface migration and recrystallization of the metal layers, particularly those of aluminum, with the resulting undesirable formation of hillocks or surface irregularities on the metal layers.

Figure 2:
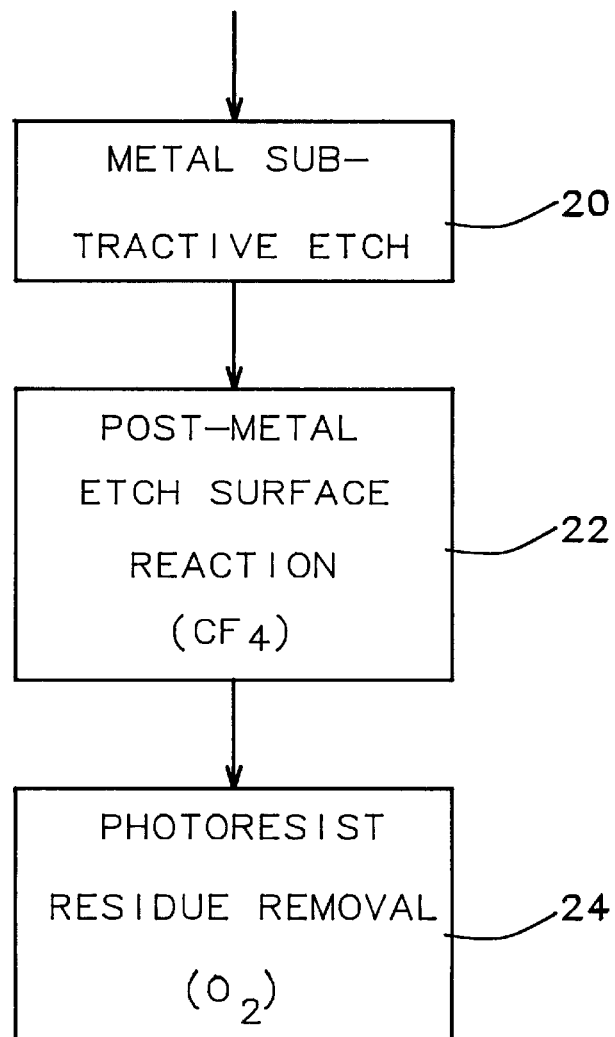
FIG. 2 is a process flow chart of the invention.

The process of this invention employs a pre-stripping step to expose the photoresist residue surface to a reactive gas for a short time at low radiofrequency (RF) power input to allow the surface material to be removed to the extent necessary to permit subsequent photoresist stripping in an oxygen plasma. The process found to be particularly useful is shown in the process flow given in FIG. 2. The reactive gas is a fluorine containing gas such as carbon tetrafluoride (CF4) or sulfur hexafluoride, for example. The first step of the process is the metal subtractive etching step 20. The second step of the process 22 is carried out in the stripping chamber of the reactor used for subtractive metal etching as a post-etching step with minimum cost impact on manufacturing. The final step of the process 24 is the photoresist stripping step in oxygen gas (O2). The details of the postetching step 22 are given in Table I:

TABLE I

| Reactive gas Flow rate, SCCM | RF Power input, watts | Exposure time, seconds | Gas Pressure, milliTorr |
| --- | --- | --- | --- |
| 20–40 | 30–500 | 10–20 | 30–200 |

The short exposure time in the metal etch chamber results in high throughput for this process as well as the maintenance of temperature sufficiently low, for example, below 220 degrees C., that no deleterious side effects result to the metal and other component portions of the integrated circuit device under fabrication. The RF power input is in the microwave region, preferably at a frequency of 2.450 gigaHertz (gHz).

While the invention has been particularly shown and described with reference to the preferred embodiment thereof, it will be understood by those skilled in the art that various changes in form and details may be made without departing from the spirit and scope of the invention.

What is claimed is:

1. A method for removal of photoresist residues remaining after metal subtractive etching in the fabrication of semiconductor integrated circuit devices comprising:

placing integrated circuit devices containing photoresist residues into the stripping chamber of a metal subtractive etch reactor after metal etching;

admitting a fluorine-containing reactive gas flow to the reactor stripping chamber;

supplying radio frequency power input to the reactor chamber; and exposing the photoresist residue surface to the fluorine-containing reactive gas to form volatile compounds with the surface for a time and radio frequency input sufficient to allow the residue surface to be removed and to permit subsequent photoresist stripping in an oxygen plasma.

2. The method of claim 1 wherein said reactive gas is selected from the group consisting of carbon tetrafluoride (CF4) and sulfur hexafluoride.

3. The method of claim 1 wherein said reactive gas flow rate is between about 20 to 40 standard cubic centimeters per second.

4. The method of claim 1 wherein said gas flow has a total pressure of between about 30 to 200 milliTorr.

5. The method of claim 1 wherein the radiofrequency power input to the reactor chamber is between about 30 to 500 watts at a frequency of 2.450 gigaHertz.

6. The method of claim 1 wherein said time is between about 90 to 150 seconds.

7. The method of claim 1 wherein said exposing the photoresist residue surface is performed at a temperature below 220 degrees C.

8. A method in the fabrication of semiconductor intetgrated circuit devices which enhances the removal rate of photoresist mask residues remaining after the subtractive etching of metal layer patterns through such masks, comprising the steps of:

placing integrated circuit devices containing photoresist residue in the reactor used for metal subtractive etching;

admitting a reactive gas flow of sulfur hexafluoride into the reactor chamber;

supplying radiofrequency power input to the reactor chamber; and exposing the photoresist residue surface to the reactive gas to form volatile compounds with the surface for a time and radio frequency input sufficient to allow the residue surface to be removed and to permit subsequent photoresist stripping in an oxygen plasma.

9. The method of claim 8 wherein said reactor is one used for conventional stripping of photoresist residues.

10. The method of claim 8 wherein said sulfur hexafluoride is admitted at a flow rate of between about 20 to 40 standard cubic centimeters per second.

11. The method of claim 8 wherein the gas flow has a pressure of between about 30 to 200 milliTorr.

12. The method of claim 8 wherein said radiofrequency power input is between about 30 to 500 watts at a frequency of 2.450 gigaHertz.

13. The method of claim 8 wherein said exposing the photoresist residue surface is for a time interval of 90 to 150 seconds.

14. The method of claim 8 wherein said temperature is maintained below 220 degrees C.

* * * * *